United States Patent
Crouch, Jr. et al.

(10) Patent No.: US 6,369,578 B1
(45) Date of Patent: Apr. 9, 2002

(54) STATE OF HEALTH FOR AUTOMOTIVE BATTERIES

(75) Inventors: Dell Albert Crouch, Jr.; Tracy Frye Strickland, both of Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/874,648

(22) Filed: Jun. 5, 2001

(51) Int. Cl.[7] .......................... H02J 7/00; G01N 27/416
(52) U.S. Cl. ........................................ 324/426; 320/134
(58) Field of Search ............................ 324/426; 320/132, 320/134

(56) References Cited

U.S. PATENT DOCUMENTS

| | | | |
|---|---|---|---|
| 4,234,840 A | 11/1980 | Konrad et al. ................ 320/48 |
| 4,560,937 A | 12/1985 | Finger ........................ 324/433 |
| 5,214,385 A | 5/1993 | Gabriel et al. .............. 324/434 |
| 5,352,968 A | 10/1994 | Reni et al. ..................... 320/35 |
| 5,596,260 A | 1/1997 | Moravec et al. .............. 320/30 |

*Primary Examiner*—Gregory Toatley
(74) *Attorney, Agent, or Firm*—Margaret A. Dobrowitsky

(57) ABSTRACT

Described is a method and apparatus for determining the state of battery life of a starting, lighting and ignition (SLI) battery comprising; 1) determining the number of starting engine cranks the battery has performed and comparing that number with a desired number for starting engine cranks to ascertain a state of health of the battery, calculated as a percentage of the desired number; 2) determining the percentage of battery life diminished due to battery exposure to a maximum temperature and the minimum state of charge the battery has been exposed to at that temperature, calculated as a decrease from 100 percent; and 3) calculating the lower of the values of step 1 or step 2 thereby determining the state of the battery life.

4 Claims, 2 Drawing Sheets

STATE OF HEALTH FOR AUTOMOTIVE BATTERIES

FIELD OF THE INVENTION

The present invention pertains to determining the state of battery life of a starting, lighting and ignition battery.

BACKGROUND OF THE INVENTION

Numerous attempts have been made to ascertain the state of charge of a starting, lighting and ignition "SLI" battery. It is particularly important to know the state of the charge of the battery so that it can be readily determined whether the battery will be useful for the immediate future. The state of charge can frequently be required to take into account the life of the battery, namely the number of cranks that the battery has been exposed to as well as the temperature that a battery has been exposed to.

U.S. Pat. No. 4,234,840 column 1, lines 11 through 20, relies upon such devices as specific gravity metering device, or ampere watt-hour metering device. The patent also took into account the terminal voltage of the batteries while energizing their load circuits.

U.S. Pat. No. 4,560,937 pertains to a battery state of charge metering method which utilized a digital integrator including a plurality of digital stages comparable to store a numeric value in binary digital form which is indicative of the state of charge.

U.S. Pat. No. 5,214,385 utilized polarization voltage to determine the charge state of a battery. A test signal is characterized by a least one transition to a charging voltage which is retained for a time sufficient to allow a polarization voltage to develop across the cell.

U.S. Pat. No. 5,352,968 pertains to a battery charge state determination which is derived from the battery voltage corrected for temperature and series resistance effects.

U.S. Pat. No. 5,596,260 pertains to an apparatus and method for determining a charge of a battery whereby initially a discharge curve specifying the battery's voltage as a function of time is determined. The battery discharge model is updated by applying Bayes theorem to the old discharge model and the voltage probability distribution.

U.S. Pat. No. 5,598,088 pertains to a method for determining the charge of a battery in which a charge balance is carried out by evaluating the charging current and the discharging current. This is checked with the aid of the measured battery open-circuit voltage and thereafter corrected. Additional variables such as battery temperature and time are likewise taken into account.

None of the references take into account the health of an SLI battery which electronically monitors the physical parameters it is exposed to while also measuring key operating features and displaying the state of health of the battery.

SUMMARY OF THE INVENTION

A method of determining the state of battery life of a starting, lighting and ignition (SLI) battery comprising; 1) determining the number of starting engine cranks the battery has performed and comparing that number with a desired number for starting engine cranks to ascertain a state of health of the battery, calculated as a percentage of the desired number; 2) determining the percentage of battery life diminished due to battery exposure to a maximum temperature and the minimum state of charge the battery has been exposed to at that temperature, calculated as a decrease from 100 percent; and 3) calculating the value, such as, the lower of the values, of step 1 or step 2 thereby determining the state of the battery life.

Also described is an apparatus for determining the state of battery life of a starting, lighting and ignition (SLI) battery comprising; 1) a first register for storing a first numeric value which is obtained by determining the number of starting engine cranks the battery has performed and comparing that number with a desired number for starting engine cranks to ascertain the state of health of the battery, calculated as a percentage of the desired number; 2) a second register storing a second numeric value which is obtained by determining the percentage of battery life diminished due to battery exposure to a maximum temperature and the minimum state of charge the battery has been exposed to at that temperature, calculated as a decrease from 100 percent; and 3) means for calculating the difference between the values of the first register and the second register to determine the state of the battery life.

DESCRIPTION OF PREFERRED EMBODIMENTS

Present invention pertains to the state of health of the battery which will be determined for any point of life in battery. "State of health" (SOH) of the battery is an indicator of the point at which the battery is in its lifetime namely, its well being. Throughout the battery's lifetime, it provides useful energy for starting a motor vehicle and for the vehicle's electrical components. When the battery has reached the end of its lifetime, the SOH is zero and the battery is no longer able to provide the useful energy needed for immediate use in starting the vehicle.

The state of the health is considered a diminishing parameter, in other words, the state of health can never increase from the initial usage but only can decrease.

There are at least two different determinations of the state of health of the battery that are constantly maintained and tracked. All determinations (SOH 1, SOH 2) are then compared to each other to determine the final state of health of the battery. For example, in one case SOH 1 determines the state of health of the battery based on normal wear out failure modes. Another SOH 2 determines the state of health of the battery based on excursions into high temperature and or low states of charge of the battery along with the normal internal resistance of the battery.

State of charge indicates the charge that is left in the battery as can be determined by any number of well known technique for determining the state of charge. See any one of the references previous discussed above in the Background of the Invention as well as many others not recited but known to the art. The state of charge is a technique that can be utilized by any well-known method. No one particular method is desirable at the present time.

Figure 1:
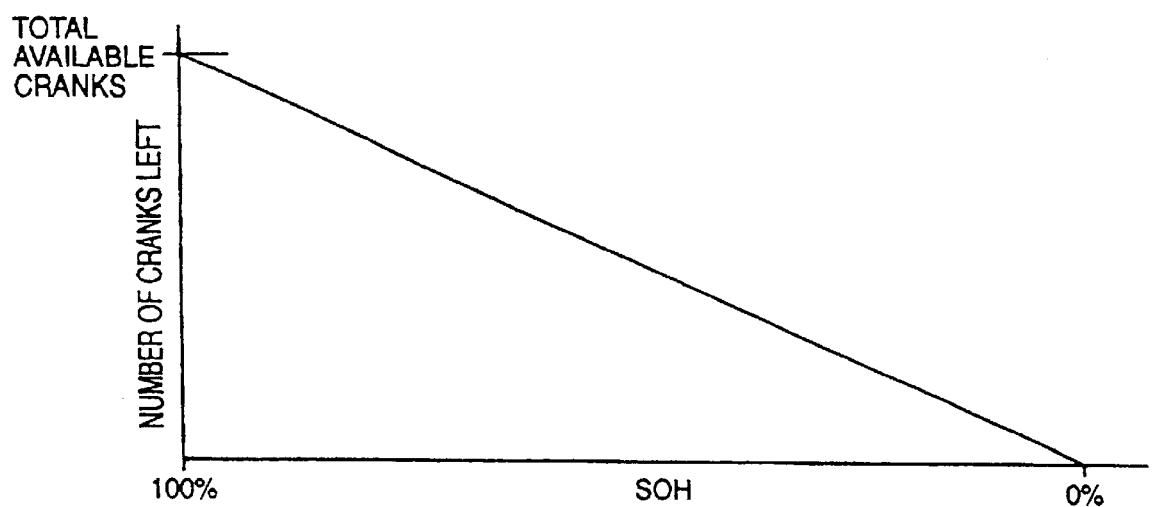
FIG. 1 is a plot of the state of health of the battery taking into account the number of cranks that are left in the battery plotting at 100% state of health and varying to 0% state of health.

To calculate SOH 1 one can assume that the battery can perform some total number of cranking current discharges over its life as "total cranks". Based on a number of cranking events that have occurred "actual cranks", SOH 1 is scaled to a percentage value through a linear function using the total cranks representing 100%. To represent that in a graph form, see FIG. 1, which plots the number of cranks left in a battery on a percentage basis in the X-axis. The values will go for 100% the total available cranks to 0% where the Y-axis indicates the number of cranks left. This can be represented by a formula as follows:

SOH 1=$a$*actual cranks+$B$

Where a is the slope of the line of FIG. 1, namely the actual cranks divided by the unit of state of health. By B is meant the number of available cranks at 100% state of health assuming normal usage at ambient temperature and pressure.

The time cycle from one cranking event to the next cranking event is known as a "crank cycle". For SOH 2 one compares the maximum battery temperature and minimum state of charge during vehicle operation from the previous cranking event to a predetermined table of percentage penalty values. A penalty value ("crank penalty") is assessed based on this status information and subtracted from the previous SOH 2 value. This "crank penalty" is reassessed for each "crank cycle" and SOH 2 is recalculated each "crank cycle". So, SOH 2=previous value of SOH 2-"crank penalty".

Therefore, the final value for the state of health "SOH" is:

SOH=a minimum (SOH 1, SOH2).

This value can be displayed on a monitor for convenience.

Since batteries are used at various temperatures, driving and starting conditions, it is possible for either SOH 1 or SOH 2 to be the lowest indicator of state of health at any given time. When initially utilizing the designed battery, a preset stored value for the state of charge for a maximum type of battery can be utilized. It is likewise to be appreciated that the stored numeric value can be placed in any central processing unit that can be a portion of a microprocessor or can be part of a PLC (program logic controller) which assists in computing the desired numerical values. These numerical values can be placed in a digitized form which is utilized as out put.

Figure 2:
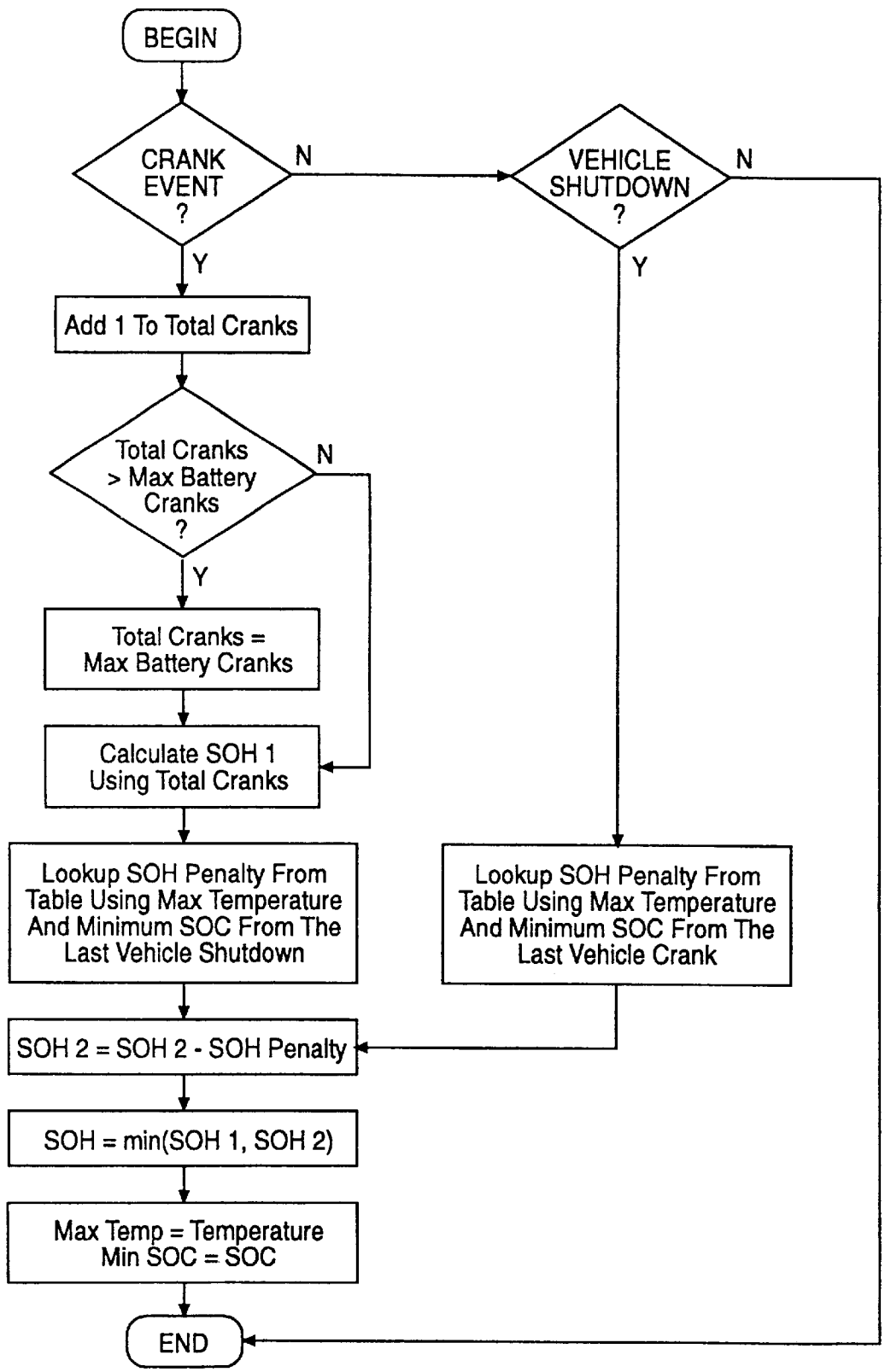
FIG. 2 is a flow chart that may be used to prepare computer program to automate the state of health determinations.

A computer program can be prepared to determine the battery state of health. An algorithm con be prepared for any central processing unit using the flow chart of FIG. 2. A look up table to determine the diminution of battery life bases on the state of charge (0–100%) of a battery when it is exposed to a certain ambient temperature is described below.

It is to be appreciated that a microprocessor of other central processing unit as a computer, personal or otherwise may be programmed to set up the appropriate registers therein. The registers will store the values, which can be compared using ordinary logic of spreadsheet software, such as Excel, and the like. After the comparison is made with the registers, the value may be displayed using LCD's (liquid crystal displays) or other displaying devices.

While the forms of the invention herein disclosed constitute presently preferred embodiments, many others are possible. It is not intended herein to mention all of the possible equivalent forms or ramifications of the invention. It is understood that the terms used herein are merely descriptive, rather than limiting, and that various changes may be made without departing from the spirit or scope of the invention.

What is claimed is:

1. A method of determining the state of battery life of a starting, lighting and ignition (SLI) battery comprising;
   1) determining the number of starting engine cranks the battery has performed and comparing that number with a desired number for starting engine cranks to ascertain a state of health of the battery, calculated as a percentage of the desired number;
   2) determining the percentage of battery life diminished due to battery exposure to a maximum temperature and the minimum state of charge the battery has been exposed to at that temperature, calculated as a decrease from 100 percent; and
   3) calculating the lower of the values of step 1 or step 2 thereby determining the state of the battery life.

2. The method of claim 1 wherein step 1 is performed by measuring the slope of the line formed when plotting on an X-Y two dimensional graph the equation $a$×actual cranks+$b$ with the Y ordinate being the number of cranks left in the battery and the X ordinate is the state of battery life; a is the slope of the line and b is the number of available cranks at normal use, optionally at ambient temperature and pressure of 25 degrees Centigrade.

3. The method of claim 1 wherein step 2 is preformed by determining a battery crank value from the table below and subtracting it from the current state of charge of the battery.

SOH CRANK PENALTY TABLE

| | TIME AVE SOC (State of Charge) | | | | | | | | | | |
|---|---|---|---|---|---|---|---|---|---|---|---|
| | 100 | 90 | 80 | 70 | 60 | 50 | 40 | 30 | 20 | 10 | 0 |
| TIME AVG TEMP Degrees F.° | | | | | | | | | | | |
| 80 | 0 | 0 | 0.1 | 0.2 | 0.3 | 0.4 | 0.8 | 1.4 | 2 | 4 | 5 |
| 70 | 0 | 0 | 0.1 | 0.15 | 0.2 | 0.3 | 0.4 | 0.8 | 1.4 | 2 | 4 |
| 60 | 0 | 0 | 0.05 | 0.1 | 0.1 | 0.2 | 0.3 | 0.4 | 1 | 1.4 | 3 |
| 50 | 0 | 0 | 0 | 0 | 0.1 | 0.2 | 0.3 | 0.35 | 0.8 | 1.3 | 2 |
| 40 | 0 | 0 | 0 | 0 | 0.1 | 0.17 | 0.2 | 0.3 | 0.6 | 1.2 | 1.5 |
| 30 | 0 | 0 | 0 | 0 | 0.1 | 0.17 | 0.2 | 0.3 | 0.5 | 1.1 | 1.4 |
| 20 | 0 | 0 | 0 | 0 | 0.1 | 0.15 | 0.17 | 0.25 | 0.4 | 1 | 1.3 |
| 10 | 0 | 0 | 0 | 0 | 0.1 | 0.15 | 0.17 | 0.2 | 0.4 | 0.8 | 1.2 |
| 0 | 0 | 0 | 0 | 0 | 0.1 | 0.15 | 0.17 | 0.2 | 0.4 | 0.7 | 1.2 |
| −10 | 0 | 0 | 0.05 | 0.1 | 0.1 | 0.15 | 0.17 | 0.2 | 0.4 | 0.6 | 1.1 |
| −20 | 0 | 0 | 0.1 | 0.1 | 0.13 | 0.15 | 0.17 | 0.2 | 0.4 | 0.5 | 1.1 |
| −30 | 0 | 0 | 0.1 | 0.1 | 0.13 | 0.15 | 0.15 | 0.17 | 0.2 | 0.5 | 1 |

State of Health Crank Penalty Table

| TIME AVG TEMP Degrees F.° | TIME AVE SOC (State of Charge) | | | | | | | | | | |
|---|---|---|---|---|---|---|---|---|---|---|---|
| | 100 | 90 | 80 | 70 | 60 | 50 | 40 | 30 | 20 | 10 | 0 |
| 80 | 0 | 0 | 0.1 | 0.2 | 0.3 | 0.4 | 0.8 | 1.4 | 2 | 4 | 5 |
| 70 | 0 | 0 | 0.1 | 0.15 | 0.2 | 0.3 | 0.4 | 0.8 | 1.4 | 2 | 4 |
| 60 | 0 | 0 | 0.05 | 0.1 | 0.1 | 0.2 | 0.3 | 0.4 | 1 | 1.4 | 3 |
| 50 | 0 | 0 | 0 | 0 | 0.1 | 0.2 | 0.3 | 0.35 | 0.8 | 1.3 | 2 |
| 40 | 0 | 0 | 0 | 0 | 0.1 | 0.17 | 0.2 | 0.3 | 0.6 | 1.2 | 1.5 |
| 30 | 0 | 0 | 0 | 0 | 0.1 | 0.17 | 0.2 | 0.3 | 0.5 | 1.1 | 1.4 |
| 20 | 0 | 0 | 0 | 0 | 0.1 | 0.15 | 0.17 | 0.25 | 0.4 | 1 | 1.3 |
| 10 | 0 | 0 | 0 | 0 | 0.1 | 0.15 | 0.17 | 0.2 | 0.4 | 0.8 | 1.2 |
| 0 | 0 | 0 | 0 | 0 | 0.1 | 0.15 | 0.17 | 0.2 | 0.4 | 0.7 | 1.2 |
| −10 | 0 | 0 | 0.05 | 0.1 | 0.1 | 0.15 | 0.17 | 0.2 | 0.4 | 0.6 | 1.1 |
| −20 | 0 | 0 | 0.1 | 0.1 | 0.13 | 0.15 | 0.17 | 0.2 | 0.4 | 0.5 | 1.1 |
| −30 | 0 | 0 | 0.1 | 0.1 | 0.13 | 0.15 | 0.15 | 0.17 | 0.2 | 0.5 | 1 |

4. An apparatus for determining the state of battery life of a starting, lighting and ignition (SLI) battery comprising; 1) a first register for storing a first numeric value which is obtained by determining the number of starting engine cranks the battery has performed and comparing that number with a desired number for starting engine cranks to ascertain the state of health of the battery, calculated as a percentage of the desired number; 2) a second register storing a second numeric value which is obtained by determining the percentage of battery life diminished due to battery exposure to a maximum temperature and the minimum state of charge the battery has been exposed to at that temperature, calculated as a decrease from 100 percent; and 3) means for calculating the difference between the values of the first register and the second register to determine the state of the battery life.

* * * * *